US007851991B2

(12) United States Patent
Nakamura et al.

(10) Patent No.: US 7,851,991 B2
(45) Date of Patent: Dec. 14, 2010

(54) ORGANIC ELECTROLUMINESCENCE DEVICE AND LIGHT EMITTING APPARATUS

(75) Inventors: Shinichi Nakamura, Machida (JP); Seishi Miura, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 560 days.

(21) Appl. No.: 11/993,083

(22) PCT Filed: Mar. 2, 2007

(86) PCT No.: PCT/JP2007/054599

§ 371 (c)(1), (2), (4) Date: Dec. 19, 2007

(87) PCT Pub. No.: WO2007/113984

PCT Pub. Date: Oct. 11, 2007

(65) Prior Publication Data

US 2010/0181898 A1 Jul. 22, 2010

(30) Foreign Application Priority Data

Mar. 31, 2006 (JP) ............................. 2006-097177

(51) Int. Cl.
*H01L 27/28* (2006.01)

(52) U.S. Cl. ..................................................... 313/504

(58) Field of Classification Search ................. 313/504, 313/506; 428/690; 445/23-25; 257/40, 257/43

See application file for complete search history.

(56) References Cited

U.S. PATENT DOCUMENTS 5,739,635 A 4/1998 Wakimoto .................. 313/504
2007/0020484 A1* 1/2007 Kim et al. .................... 428/690

FOREIGN PATENT DOCUMENTS

JP 09-017574 1/1997
JP 10270172 10/1998

(Continued)

OTHER PUBLICATIONS

Simon, "Group 1 and 2 suboxides and subnitrides—metals with atomic size holes and tunnels"; Coordination Chemistry Reviews; 163, 253-270 (1997).

(Continued)

*Primary Examiner*—Joseph L Williams
*Assistant Examiner*—Andrew J Coughlin
(74) *Attorney, Agent, or Firm*—Fitzpatrick, Cella, Harper & Scinto

(57) ABSTRACT

There is provided an organic electroluminescence device includes: a pair of electrodes formed of an anode and a cathode; and an organic compound layer provided between the pair of electrodes, in which the organic electroluminescence device contains a cesium suboxide in which an element ratio A/B calculated from an area ratio of a peak A at a binding energy of 726.0 eV±0.5 eV corresponding to a Cs3d5 orbital measured by X-ray photoelectron spectroscopy to a peak B at binding energy of 531.0 eV±0.5 eV corresponding to an O1s orbital measured by the X-ray photoelectron spectroscopy is in a range of 3.1 to 7.3. The organic electroluminescence device has excellent light emitting property that is not largely impaired even after the device is driven for a long time period.

8 Claims, 3 Drawing Sheets

FOREIGN PATENT DOCUMENTS

| | | |
|---|---|---|
| JP | 2004-095491 | 3/2004 |
| JP | 2004192842 | 7/2004 |
| JP | 2005-293961 | 10/2005 |

OTHER PUBLICATIONS

PCT Notification Concerning Transmittal of International Preliminary Report on Patentability (Chapter 1 or Chapter 2 of the Patent Cooperation Treaty) (Form PCT/IB/338); International Preliminary Report on Patentability (Chapter 1 of the Patent Cooperation Treaty) (Form PCT/IB/373); Written Opinion of The International Searching Authority (Form PCT/ISA/237), regarding Internation Application No. PCT/JP2007/054599.

* cited by examiner

ORGANIC ELECTROLUMINESCENCE DEVICE AND LIGHT EMITTING APPARATUS

TECHNICAL FIELD

The present invention relates to an organic electroluminescence device and alight emitting apparatus utilizing the device.

BACKGROUND ART

An organic electroluminescence device is expected to be put into practical use as a next-generation display device because of its advantages over a liquid crystal display such as (1) a low power consumption, (2) a good view angle, (3) potential for becoming additionally thin, and (4) potential for enabling the utilization of a flexible substrate.

However, the organic electroluminescence device still involves a large number of problems to be solved before the device is put into practical use. Examples of the problems include low light emitting property, a short lifetime, and the difficulty of a process for turning the device into a thin film having a thickness at a level of several tens of nanometers. In particular, an improvement in property with which charge is injected from an electrode into an organic compound layer is indispensable for alleviating the low light emitting property and the short lifetime.

Doping the organic compound layer with, for example, an alkali metal, or an oxide, peroxide, or salt of the alkali metal is known to alleviate the low light emitting property and the short lifetime (Japanese Patent No. 3529543, Japanese Patent Application Laid-Open No. H10-270172, and Japanese Patent Application Laid-Open No. 2004-192842). In addition, with regard to a cesium suboxide, various compounds have been known (Coordination Chemistry Reviews, 163 (1997), 253-270).

Although the low light emitting property has been alleviated to some extent by an improvement in charge injecting property, the problem concerning the lifetime is not sufficiently solved yet.

DISCLOSURE OF THE INVENTION

An object of the present invention is to provide an organic electroluminescence device which has excellent light emitting property that is not largely impaired even after the device is driven for a long time period, and a light emitting apparatus utilizing the device.

According to the present invention, there is provided an organic electroluminescence device including: a pair of electrodes formed of an anode and a cathode; and an organic compound layer provided between the pair of electrodes, in which the organic electroluminescence device contains a cesium suboxide in which an element ratio A/B calculated from an area ratio of a peak A at a binding energy of 726.0 eV±0.5 eV corresponding to a Cs3d5 orbital measured by X-ray photoelectron spectroscopy to a peak B at a binding energy of 531.0 eV±0.5 eV corresponding to an O1s orbital measured by the X-ray photoelectron spectroscopy is in a range of 3.1 to 7.3.

According to the present invention, there can be provided an organic electroluminescence device which is excellent in light emitting property and lifetime and which has high productivity. In addition, there can be provided a light emitting apparatus that can be suitably used in the information display portion of a display by utilizing the device.

BEST MODE FOR CARRYING OUT THE INVENTION

Hereinafter, the present invention will be described in detail.

Figure 1A:
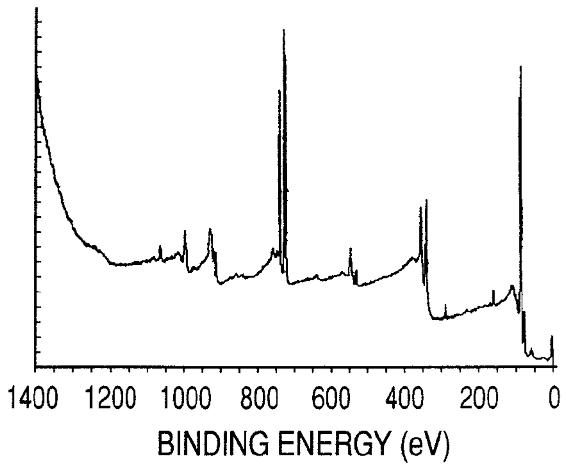
FIGS. 1A, 1B, and 1C are each a representative example of the binding energy chart by X-ray photoelectron spectroscopy of a film obtained by the vacuum vapor deposition of a metal cesium dispenser under the introduction of 0.3 L of oxygen.

FIG. 1A is a representative example of the binding energy chart by X-ray photoelectron spectroscopy of a film obtained by the vacuum vapor deposition of a metal cesium dispenser (manufactured by SAES Getters) onto a gold substrate by resistance heating under the introduction of 0.3 L (1 L=$10^{-6}$ torr·s) of oxygen. In addition, FIGS. 1B and 1C are an enlarged view of a portion including a peak at binding energy corresponding to a Cs3d5 orbital in FIG. 1A, and an enlarged view of a portion including a peak at a binding energy corresponding to an O1s orbital in FIG. 1A, respectively.

Figure 1B:
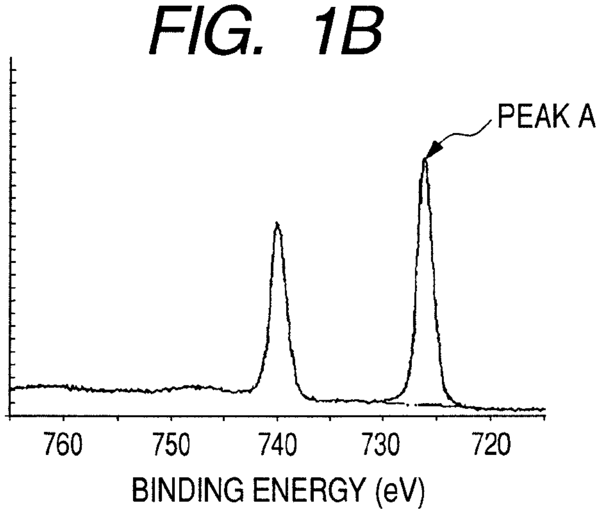

In FIG. 1B, one kind of a peak, that is, a peak A is observed. In FIG. 1C, two kinds of peaks, that is, a peak B and a peak C are observed. That is, the figures mean that cesium atoms of at least one kind different from each other in binding state and oxygen atoms of at least two kinds are present in the vapor-deposited film. The inventors of the present invention have made extensive studies while paying attention to the peaks A and B among the peaks. As a result, they have found that an element ratio A/B calculated from an area ratio of the peak A to the peak B largely affects improvements in light emitting property and lifetime of an organic electroluminescence device.

Figure 1C:
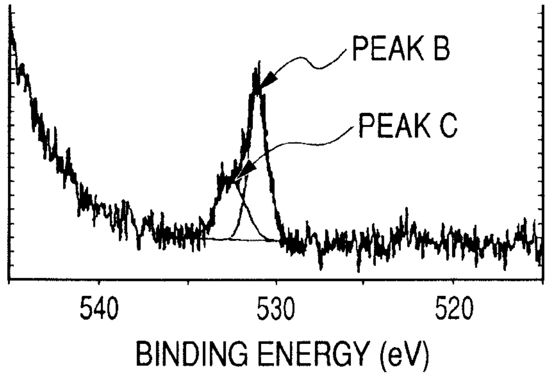

FIGS. 1A to 1C each show an example of the measurement of a cesium suboxide formed on a gold substrate. A component of a vapor-deposited product does not change on an inert substrate. Therefore, the cesium suboxide present in a device of the present invention is also assumed to be in conformance with the fact except for an interaction with an organic compound. An element ratio A/B of less than 3.1 reduces the luminous efficiency of the device while an element ratio A/B in excess of 7.3 deteriorates the lifetime of the device. In addition, the element ratio A/B is preferably 3.1 to 4.2 in order that an effect of the present invention may be additionally significant. Although the structure of the cesium suboxide cannot be clearly identified, assumed examples of the structure include $Cs_{11}O_3$, $(Cs_{11}O_3)Cs$, and $(Cs_{11}O_3)Cs_{10}$.

The organic electroluminescence device of the present invention is effective in each of a bottom emission type (BE type) structure in which emitted light is extracted from a substrate side and a top emission type (TE type) structure in which light is extracted from a side opposite to a substrate. The present invention will be described in more detail with reference to FIGS. 2 and 3.

Figure 2:
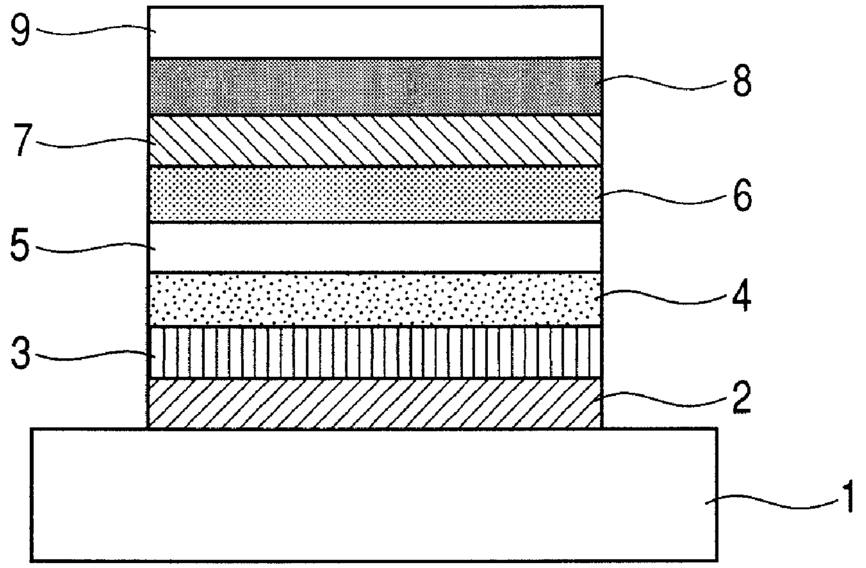
FIG. 2 is an example of a schematic sectional view of an organic electroluminescence device of the present invention.
Figure 3:
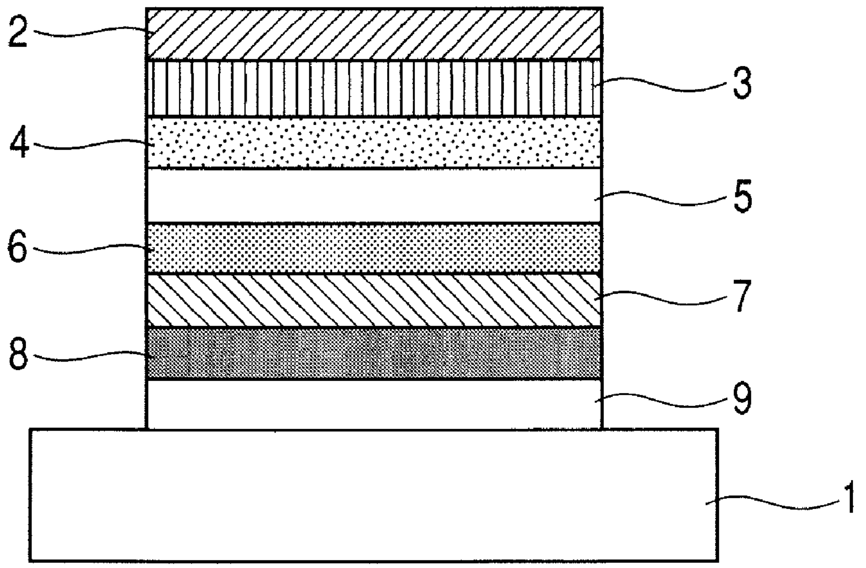
FIG. 3 is an example of a schematic sectional view of the organic electroluminescence device of the present invention.

FIGS. 2 and 3 are each an example of a schematic sectional view showing the organic electroluminescence device of the present invention. In FIG. 2, the anode 2 is placed on the substrate 1, and the hole injecting layer 3, the hole transporting layer 4, the light emitting layer 5, the electron transporting layer 6, the electron injecting layer 7, the cesium suboxide layer 8, and the cathode 9 are placed in the stated order on the resultant. The organic electroluminescence device of the present invention may be structured as shown in FIG. 3: the cathode 9 is placed on the substrate 1, and the cesium suboxide layer 8, the electron injecting layer 7, the electron transporting layer 6, the light emitting layer 5, the hole transporting layer 4, the hole injecting layer 3, and the anode 2 are placed in the stated order on the resultant.

In addition, the cesium suboxide layer 8, which is positioned between the cathode 9 and the electron injecting layer 7 in each of the figures, may be positioned at an arbitrary site in the organic electroluminescence device. In addition, the cesium suboxide, which may form by itself, for example, an electron injecting layer or an electron transporting layer, is preferably incorporated as a mixed layer in at least one organic compound layer such as an electron injecting layer or an electron transporting layer in order that the effect of the present invention may be additionally significant. The constituent elements indispensable to the present invention are the cesium suboxide, the anode 2, the cathode 9, and the light emitting layer 5, and at least one of the hole injecting layer 3, the hole transporting layer 4, the electron transporting layer 6, and the electron injecting layer 7 can be removed for the simplification of a process for producing the device.

In addition, a layer containing the cesium suboxide, that is, a layer formed only of the cesium suboxide or an organic compound layer containing the cesium suboxide is preferably in substantial electrical contact with the cathode 9 in order that the property with which charge is injected from an electrode into an organic compound layer may be improved. The term "substantial electrical contact" refers to the case where electron injecting property is improved even when another layer such as an organic compound layer, an inorganic compound layer, or a layer containing the mixture of organic and inorganic substances is provided between the cathode 9 and the layer containing the cesium suboxide.

The cesium suboxide can be incorporated into the organic electroluminescence device by the vapor deposition of metal cesium under the introduction of oxygen. In this case, an effective amount of oxygen to be introduced is 0.1 L to 0.5 L, though the amount of oxygen to be introduced is not particularly limited to the extent that the cesium suboxide of the present invention can be obtained. Metal cesium has so high reactivity that it is difficult to handle the metal cesium. Accordingly, the use of a metal cesium dispenser manufactured by SAES Getters, which is said to generate only metal cesium, instead of metal cesium is effective. In addition, the cesium suboxide can be produced also from a decomposed product of a cesium compound such as cesium oxide or cesium carbonate. In addition, a film formation rate is not particularly limited to the extent that the cesium suboxide is stably deposited from the vapor. A film formation rate measured with, for example, a quartz resonator is in the range of 0.001 nm/sec to 1 nm/sec. A ratio of the film formation rate of the organic compound to the film formation rate of the cesium suboxide (the film formation rate of the organic compound)/(the film formation rate of the cesium suboxide), which is not particularly limited, is in the range of, for example, 0.1 to 100.

Hereinafter, organic compound layers to be used in the present invention will be described.

Examples of a material for the hole transporting layer include, but not limited to, low-molecular-weight compounds such as a triphenyldiamine derivative, an oxadiazole derivative, a polyphilyl derivative, and a stilbene derivative, and conjugate polymer compounds such as a poly(3,4-ethylenedioxythiophene) derivative, a polythienylene vinylene derivative, a polyphenylene vinylene derivative, and a polypyridine derivative. A low-molecular-weight compound is preferable because a vapor deposition process can be employed in the formation of the layer from the compound. The term "low-molecular-weight compound" as used in the present invention refers to a compound having a molecular weight of 3,000 or less. Particularly preferable structures are shown below.

H-1

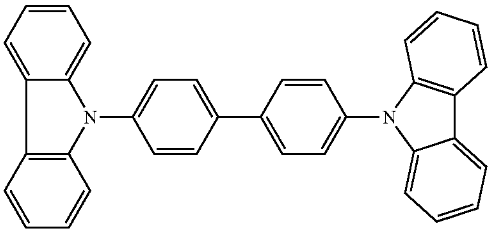

H-2

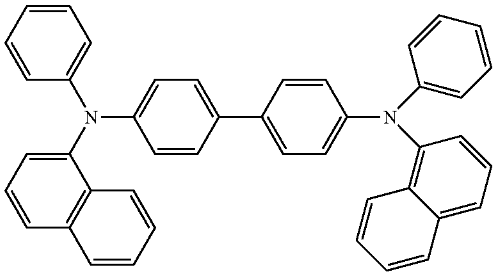

H-3

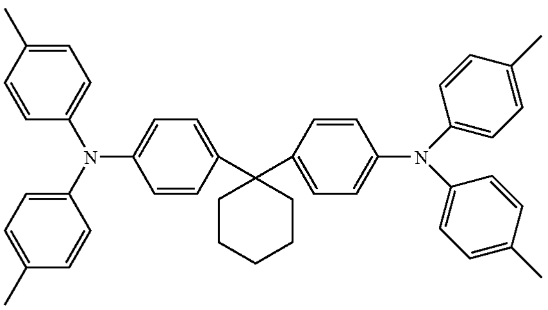

-continued
H-4
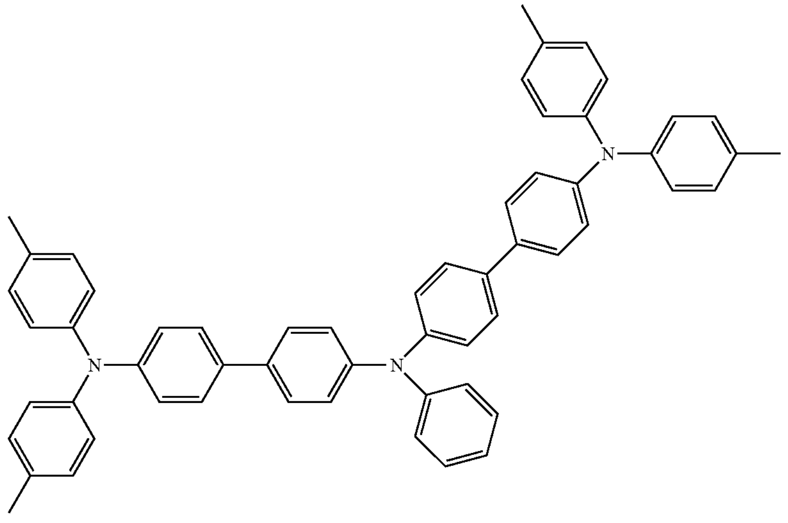
H-5
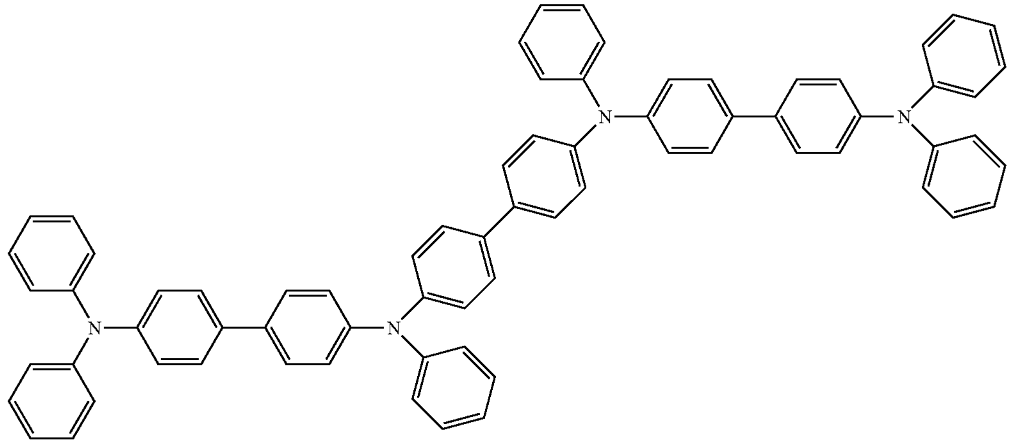
H-6
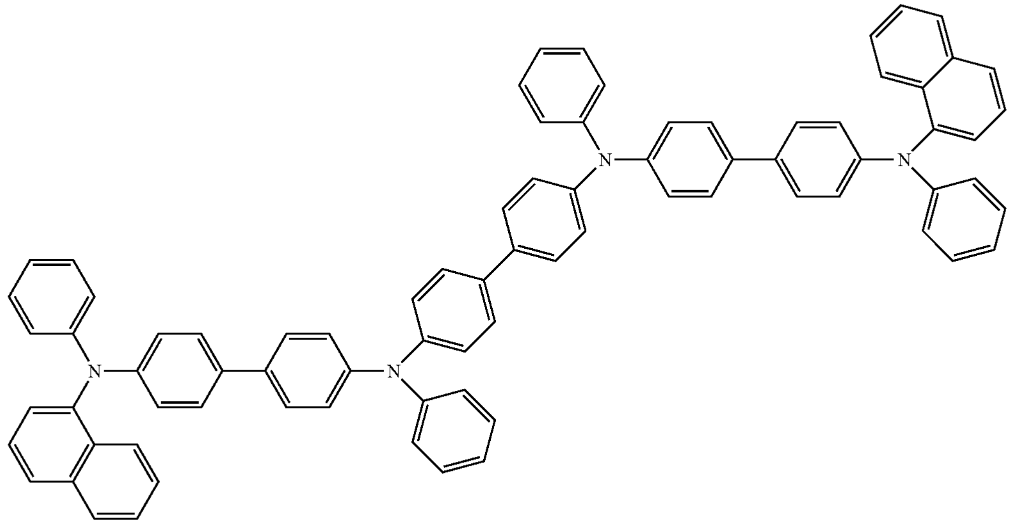

-continued

H-7

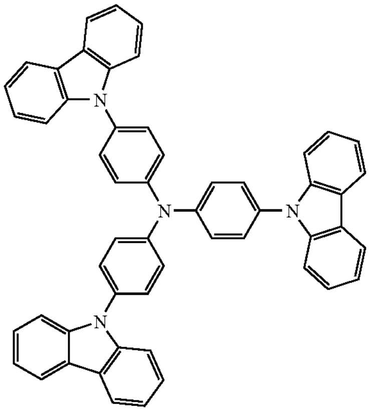

H-8

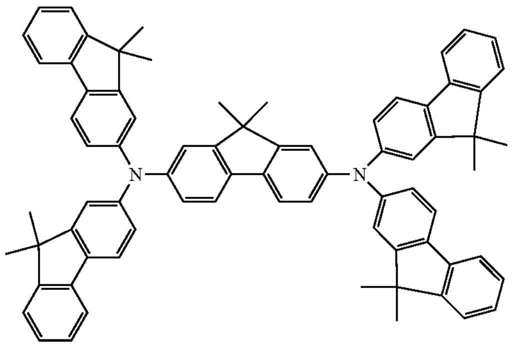

H-9

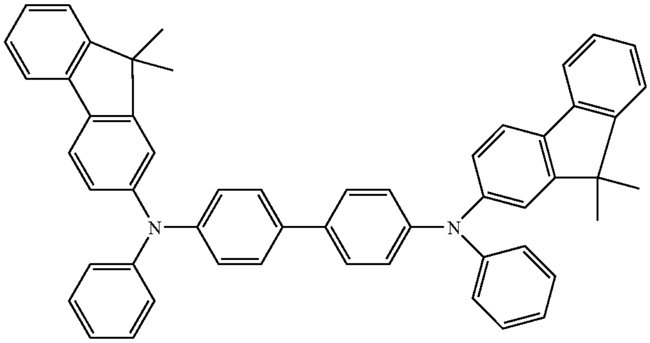

Examples of a material for the electron transporting layer include, but not limited to, an aluminum quinolinol derivative, an oxadiazole derivative, a triazole derivative, a phenylquinoxaline derivative, and a silole derivative. A low-molecular-weight compound is preferable because a vapor deposition process can be employed in the formation of the layer from the compound. Particularly preferable structures are shown below.

E-1

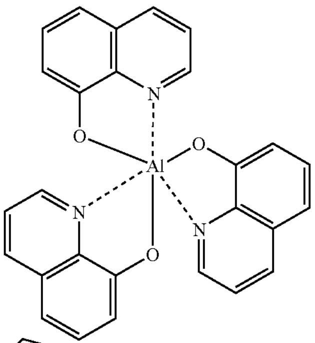

E-2

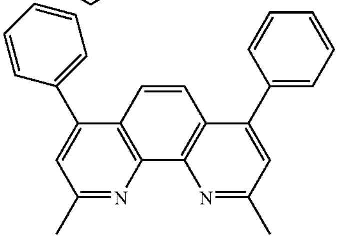

-continued

E-3

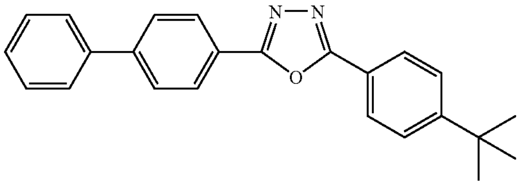

E-4

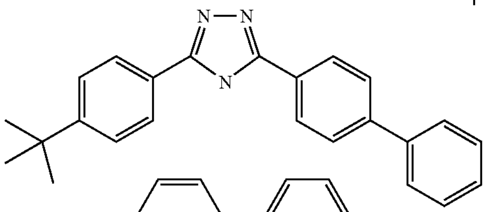

E-5

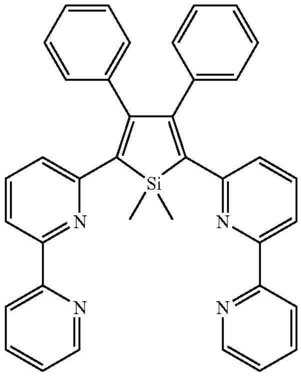

-continued

E-6

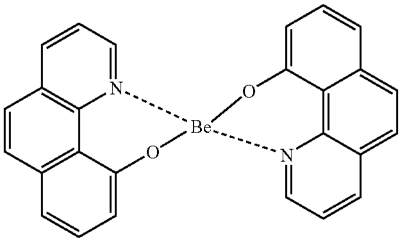

E-7

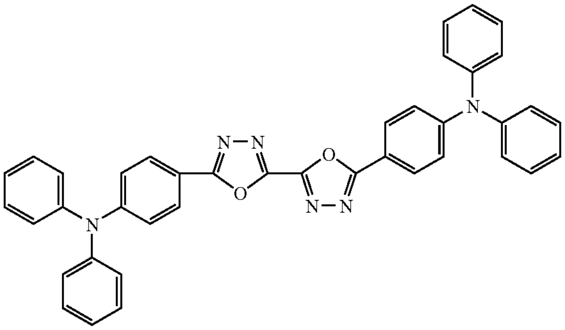

E-8

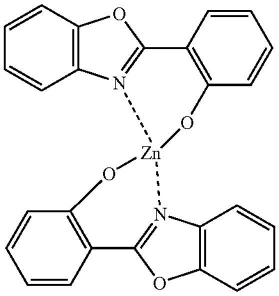

E-9

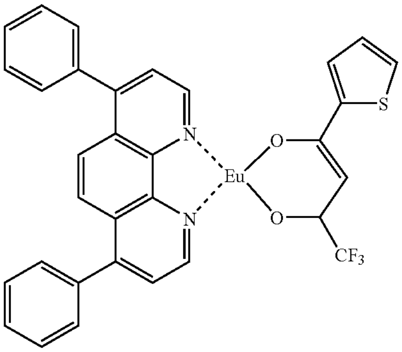

-continued

E10

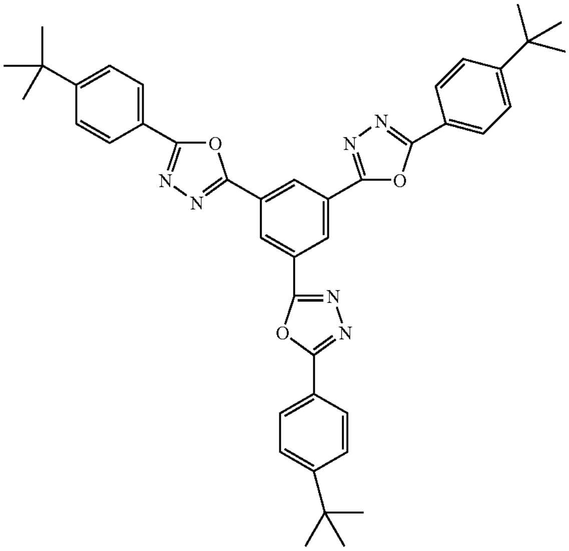

E-11

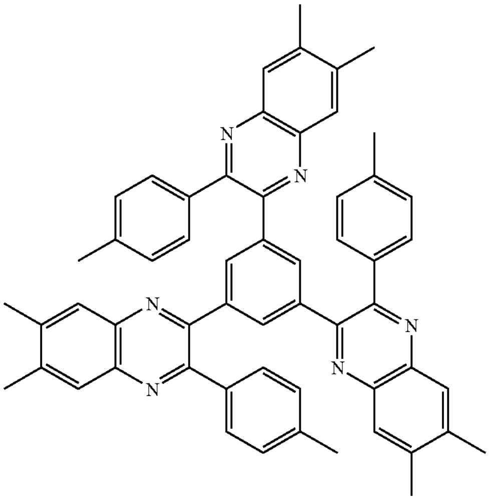

E-12

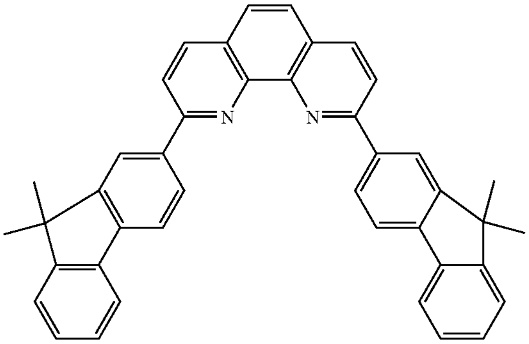

Examples of a material for the light emitting layer include, but not limited to, any one of the above-mentioned materials used in the hole transporting layer, any one of the above-mentioned materials used in the electron transporting layer, a triarylamine derivative, a stilbene derivative, a polyarylene derivative, an aromatic fused polycyclic compound, an aromatic heterocyclic compound, an aromatic fused heterocyclic compound, an oligo body or composite oligo body formed of at least one of those described above, an Al complex, an Mg complex, a zinc complex, an Ir complex, an Au complex, an Ru complex, an Re complex, and an Os complex. A low-molecular-weight compound is preferable because a vapor deposition process can be employed in the formation of the layer from the compound. In addition, a mixed layer obtained by doping the hole transporting layer or the electron transporting layer with one or more kinds of those light emitting materials may be used as the light emitting layer. Particularly preferable structures are shown below.

A-1

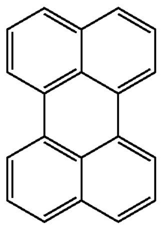

A-2

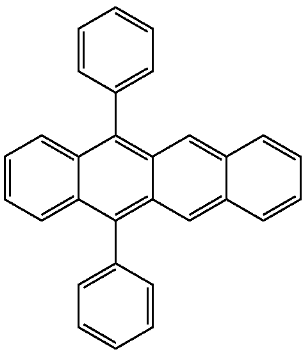

A-3

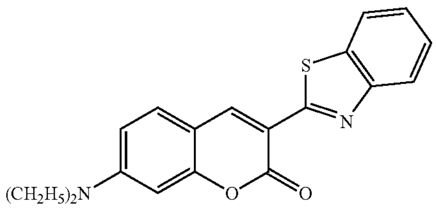

A-4

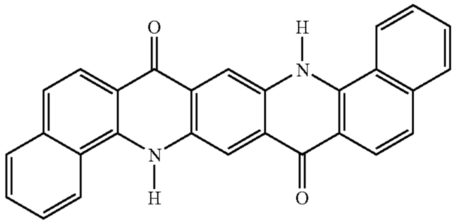

A-5

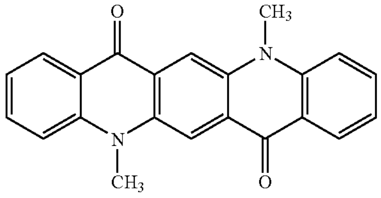

-continued

A-6

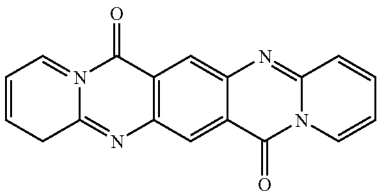

A-7

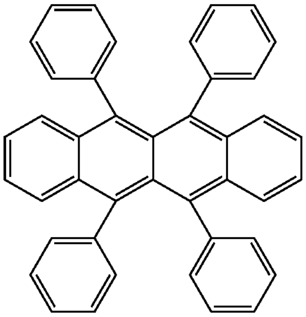

A-8

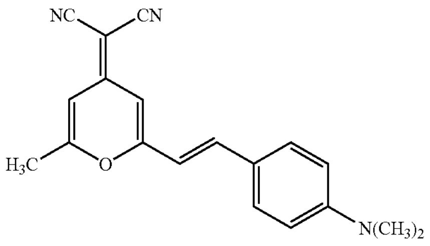

A-9

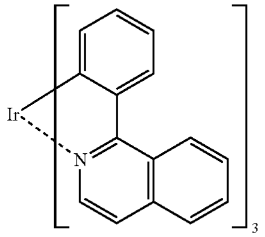

A-10

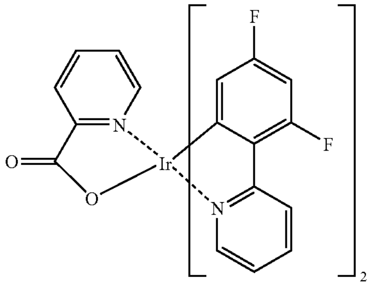

A-11

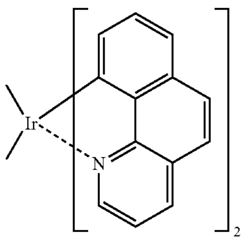

-continued

A-12

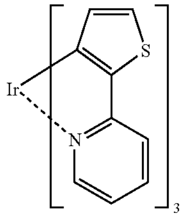

The substrate to be used in the present invention is not particularly limited. Examples of a material that can be used in the substrate include: inorganic materials such as glass and quartz; photosensitive polymer compounds such as acrylic, vinyl-based, ester-based, imide-based, urethane-based, diazo-based, and cinnamoyl-based photosensitive polymer compounds; organic materials such as polyvinylidene fluoride, polyethylene terephthalate, and polyethylene; and organic/inorganic hybrid materials. A laminated structure containing two or more of those materials can also be used. In addition, an active device such as a TFT may be provided.

Examples of a suitable material for the anode to be used in the present invention include: metal materials such as Al, Cu, Ti, Au, Pt, Ag, Cr, Pd, Se, and Ir, and alloy materials of these metal materials; and inorganic materials such as polysilicon, silicide, indium tin oxide (ITO), indium tin zinc oxide (ITZO), indium zinc oxide (IZO), and $SnO_2$. For example, conductive polymers typified by highly doped polypyridine, highly doped polyacetylene, highly doped polyaniline, highly doped polypyrrole, and highly doped polythiophene, and conductive ink in which a carbon particle or a silver particle is dispersed are also suitable. In the case of the organic electroluminescence device shown in FIG. 2, a transparent electrode made of, for example, ITO, ITZO, or IZO having high transparency is preferable for a BE type, and a metal material such as Ag or Cr having a high reflectivity is preferable for a TE type. A laminated structure containing two or more of those materials such as an Al/ITO structure, an Ag/IZO structure, or an ITO/Al/ITO structure can also be used.

Examples of a material for the cathode to be used in the present invention include: metal materials such as Al, Mg, Ca, Cu, Ti, Au, Pt, Ag, Cr, Pd, Se, and Ir, and alloy materials of these metal materials; inorganic materials such as polysilicon, silicide, indium tin oxide (ITO), indium tin zinc oxide (ITZO), indium zinc oxide (IZO), and $SnO_2$; conductive polymers typified by highly doped polypyridine, highly doped polyacetylene, highly doped polyaniline, highly doped polypyrrole, and highly doped polythiophene; and conductive ink in which a carbon particle or a silver particle is dispersed. A laminated structure containing two or more of those materials such as an Ag/Mg structure, an Al/Mg structure, or an Ag/Mg/Ag structure can also be used. A transparent electrode made of, for example, ITO, ITZO, or IZO having high transparency is preferable in order that emitted light may be efficiently extracted.

Methods of forming the cathode, the anode, the organic compound layers, and the layer containing the cesium suboxide to be used in the present invention are not particularly limited. An organic material can be formed into such layer by, for example, an electrolytic polymerization method, a casting method, a spin coating method, an immersion coating method, a screen printing method, a micromolding method, a microcontact method, a roll coating method, an ink-jet method, or an LB method. A vacuum vapor deposition method, a CVD method, an electron beam vapor deposition method, a resistance heating vapor deposition method, a sputtering method, or the like can also be an effective formation method depending on a material to be used. In addition, the layers and the electrodes can be patterned into desired shapes by photolithography and an etching treatment. In addition, each of soft lithography and the ink-jet method is also an effective patterning method.

The thicknesses of the anode, cathode, organic compound layers, and layer containing the cesium suboxide of the present invention, which are not particularly limited, are each preferably in the range of 0.1 nm or more to 10 μm or less. Further, light is preferably extracted from at least the cathode side of the organic electroluminescence device of the present invention.

A light emitting apparatus of the present invention is characterized by including, in its surface, a plurality of organic electroluminescence devices each of which is the above-mentioned organic electroluminescence device of the present invention. The apparatus is preferably used in the information display portion of a display. The size of the display, which is not particularly restricted, is preferably in the range of, for example, 1 inch to 30 inches. The number of pixels is not restricted, and, for example, QVGA (320×240 pixels), a VGA (640×480 pixels), an XGA (1024×728 pixels), an SXGA (1280×1024 pixels), a UXGA (1600×1200 pixels), or a QXGA (2048×1536 pixels) can be adopted. In addition, the apparatus is preferably capable of displaying colors. In this case, each of a method involving independently arraying red, blue, and green light emitting devices to display colors and a method involving the use of a color filter is effective. In addition, each of a simple matrix method and an active matrix method can be effectively employed for driving the apparatus.

Hereinafter, the present invention will be described in more detail by way of examples. However, the present invention is not limited to these examples.

Example 1

Figure 4:
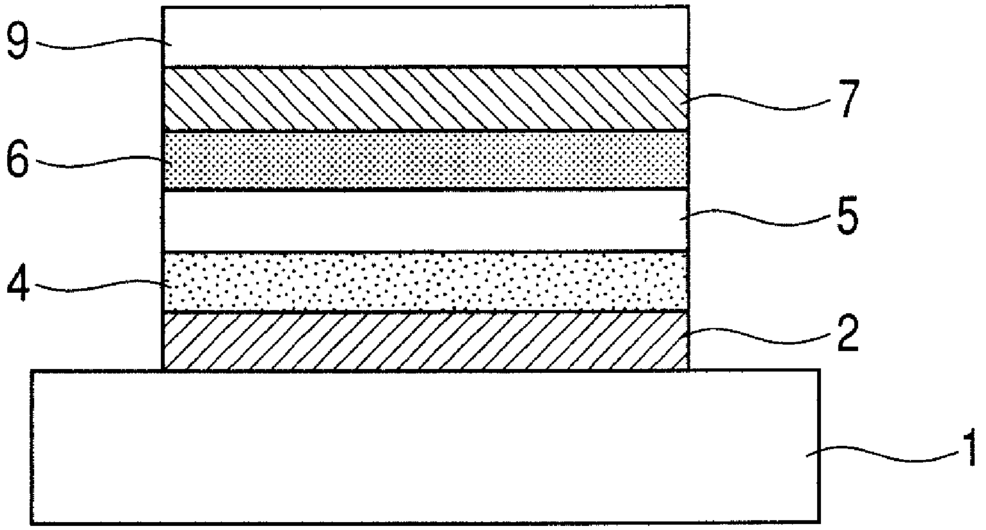
FIG. 4 is a schematic sectional view of an organic electroluminescence device to be produced in each of Examples 1 and 3 to 5.

FIG. 4 is a schematic sectional view showing an organic electroluminescence device produced in this example.

Glass was used in the substrate 1, ITO was used in the anode 2, H-9 was used in the hole transporting layer 4, E-1 was used in the light emitting layer 5, E-2 was used in the electron transporting layer 6, cesium suboxide was used in the electron injecting layer 7, and aluminum was used in the cathode 47. A production procedure for the device is shown below.

ITO was formed into a film having a thickness of 50 nm (anode 2) on the glass substrate 1 by a sputtering method. After that, the resultant was washed with acetone and isopropyl alcohol, and was then dried in a vacuum. After that, the surface of ITO was subjected to a UV/ozone treatment.

Next, the hole transporting layer 4, the light emitting layer 5, and the electron transporting layer 6 were continuously deposited from the vapor by using a vacuum vapor deposition apparatus under the following conditions, whereby laminated films were obtained.

Hole transporting layer 4: H-9 was formed into a film having a thickness of 50 nm at a film formation rate of 0.50 nm/sec or more to 0.52 nm/sec or less.

Light emitting layer 5: E-1 was formed into a film having a thickness of 30 nm at a film formation rate of 0.30 nm/sec or more to 0.32 nm/sec or less.

Electron transporting layer 6: E-2 was formed into a film having a thickness of 30 nm at a film formation rate of 0.30 nm/sec or more to 0.32 nm/sec or less.

Next, a metal cesium dispenser (manufactured by SAES Getters) was deposited from the vapor by resistance heating under the introduction of 0.3 L of oxygen at a film formation rate of 0.05 nm/sec or more to 0.06 nm/sec or less, whereby a film having thickness of 3 nm (electron injecting layer 7) was formed.

After that, aluminum was formed into a film having a thickness of 150 nm (cathode 9) at a film formation rate of 1.0 nm/sec or more to 1.2 nm/sec or less. Under a nitrogen atmosphere, the resultant device was finally sealed with a glass cap containing a moisture gettering agent, whereby an organic electroluminescence device was obtained.

Next, current efficiency upon application of a DC voltage of 10 V was measured and defined as an initial value. Next, the organic electroluminescence device was caused to emit light at room temperature continuously for 200 hours, and then current efficiency was similarly measured. In addition, the device was evaluated for its lifetime by calculating a rate of change ((the initial value of the current efficiency−a value after the continuous light emission for 200 hours)×100/the initial value of the current efficiency (%)). The results are shown below.

| | |
|---|---|
| Current efficiency after continuous light emission for 200 hours | 4.9 cd/A |
| Rate of change | 6.8% |

In addition, chromium was formed into a film having a thickness of 5 nm on a glass substrate separately prepared, and then gold was formed into a film having a thickness of 50 nm on the resultant. A film was formed on the resultant under the same conditions as those of the electron injecting layer 7. The resultant film was measured by X-ray photoelectron spectroscopy (measuring device: ESCALAB 220i-XLVG/manufactured by Scientific). As a result, a peak at a binding energy of 726.2 eV corresponding to a Cs3d5 orbital, and two kinds of peaks at binding energies of 531.1 eV and 532.7 eV corresponding to an O1s orbital were obtained. The element ratio A/B calculated from an area ratio of the peak A (726.2 eV) to the peak B (531.1 eV) among the peaks was 4.2.

Comparative Example 1

An organic electroluminescence device was produced by the same approach as that of Example 1 except that the electron injecting layer 7 was formed under the introduction of 1.0 L of oxygen.

Next, the device was evaluated for each of its current efficiency and lifetime by the same approach as that of Example 1. The results are shown below.

| | |
|---|---|
| Current efficiency after continuous light emission for 200 hours | 3.3 cd/A |
| Rate of change | 15.0% |

In addition, chromium was formed into a film having a thickness of 5 nm on a glass substrate separately prepared, and then gold was formed into a film having a thickness of 50 nm on the resultant. A film was formed on the resultant under the same conditions as those of the electron injecting layer 7. The resultant film was measured by X-ray photoelectron spectroscopy. As a result, a peak at a binding energy of 725.5 eV corresponding to a Cs3d5 orbital, and two kinds of peaks at binding energies of 530.5 eV and 532.5 eV corresponding to an O1s orbital were obtained. The element ratio A/B calculated from an area ratio of the peak A (725.5 eV) to the peak B (530.5 eV) among the peaks was 2.3.

Comparative Example 2

An organic electroluminescence device was produced by the same approach as that of Example 1 except that oxygen was not introduced upon formation of the electron injecting layer 7.

Next, the device was evaluated for each of its current efficiency and lifetime by the same approach as that of Example 1. The results are shown below.

| | |
|---|---|
| Current efficiency after continuous light emission for 200 hours | 2.3 cd/A |
| Rate of change | 54.0% |

In addition, chromium was formed into a film having a thickness of 5 nm on a glass substrate separately prepared, and then gold was formed into a film having a thickness of 50 nm on the resultant. A film was formed on the resultant under the same conditions as those of the electron injecting layer 7. The resultant film was measured by X-ray photoelectron spectroscopy. As a result, a peak at a binding energy of 726.3 eV corresponding to a Cs3d5 orbital was obtained, but no peak at a binding energy corresponding to an O1s orbital was obtained.

Example 2

Figure 5:
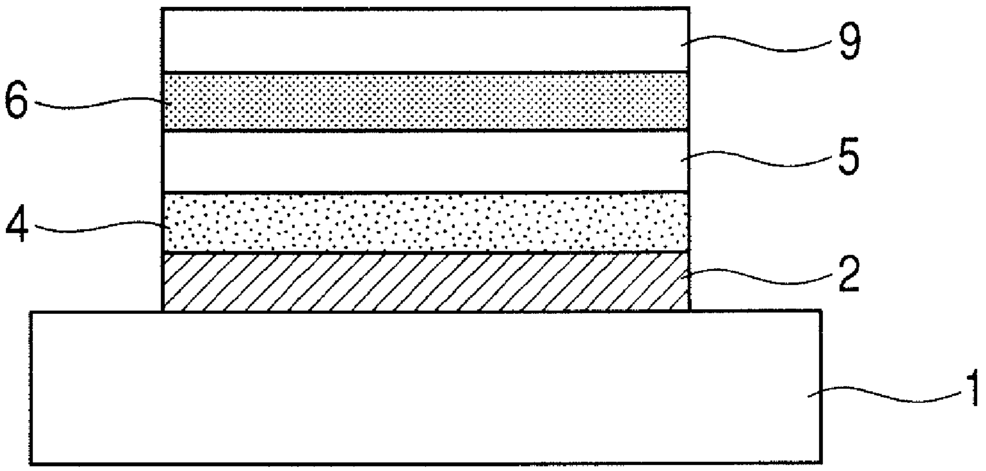
FIG. 5 is a schematic sectional view of an organic electroluminescence device to be produced in Example 2.

FIG. 5 is a schematic sectional view showing an organic electroluminescence device produced in this example.

Glass was used in the substrate 1, ITO was used in the anode 2, H-2 was used in the hole transporting layer 4, the mixture of E-1 and A-3 was used in the light emitting layer 5, the mixture of E-1 and a cesium suboxide was used in the electron transporting layer 6, and aluminum was used in the cathode 9. A production procedure for the device is shown below.

ITO was formed into a film having a thickness of 80 nm (anode 2) on the glass substrate 1 by a sputtering method. After that, the resultant was washed with acetone and isopropyl alcohol, and was then dried in a vacuum. After that, the surface of ITO was subjected to a UV/ozone treatment.

Next, H-2 was deposited from the vapor at a film formation rate of 0.50 nm/sec or more to 0.52 nm/sec or less by using a vacuum vapor deposition apparatus, whereby a film having a thickness of 40 nm (hole transporting layer 4) was formed. Next, E-1 and A-3 were co-deposited from the vapor, whereby a film of the mixture of E-1 and A-3 having a thickness of 30 nm (light emitting layer 5) was formed. At this time, the film formation rate of E-1 was 0.20 nm/sec or more to 0.23 nm/sec or less, and the film formation rate of A-3 was 0.05 nm/sec or more to 0.07 nm/sec or less.

Next, a metal cesium dispenser (manufactured by SAES Getters) and E-1 were co-deposited from the vapor under the introduction of 0.1 L of oxygen, whereby a film of the mixture of the metal cesium dispenser and E-1 having a thickness of 40 nm (electron transporting layer 6) was formed. At this time, the film formation rate of the cesium suboxide was 0.05 nm/sec or more to 0.06 nm/sec or less, and the film formation rate of E-1 was 0.20 nm/sec or more to 0.23 nm/sec or less.

After that, aluminum was formed into a film having a thickness of 150 nm (cathode 9) at a film formation rate of 1.0 nm/sec or more to 1.2 nm/sec or less. Under a nitrogen atmosphere, the resultant device was finally sealed with a glass cap containing a moisture gettering agent, whereby an organic electroluminescence device was obtained.

Next, the device was evaluated for each of its current efficiency and lifetime by the same approach as that of Example 1. The results are shown below.

| | |
|---|---|
| Current efficiency after continuous light emission for 200 hours | 9.3 cd/A |
| Rate of change | 9.8% |

In addition, chromium was formed into a film having a thickness of 5 nm on a glass substrate separately prepared, and then gold was formed into a film having a thickness of 50 nm on the resultant. A film was formed on the resultant under the same conditions as those of the electron transporting layer 6. The resultant film was measured by X-ray photoelectron spectroscopy. As a result, a peak at a binding energy of 726.1 eV corresponding to a Cs3d5 orbital, and two kinds of peaks at binding energies of 531.2 eV and 532.8 eV corresponding to an O1s orbital were obtained. The element ratio A/B calculated from an area ratio of the peak A (726.2 eV) to the peak B (531.2 eV) among the peaks was 7.3.

Comparative Example 3

An organic electroluminescence device was produced by the same approach as that of Example 2 except that the electron transporting layer 6 was formed under the introduction of 3.0 L of oxygen upon vacuum vapor deposition of the metal cesium dispenser by resistance heating.

Next, the device was evaluated for each of its current efficiency and lifetime by the same approach as that of Example 1. The results are shown below.

| | |
|---|---|
| Current efficiency after continuous light emission for 200 hours | 4.6 cd/A |
| Rate of change | 13.4% |

In addition, chromium was formed into a film having a thickness of 5 nm on a glass substrate separately prepared, and then gold was formed into a film having a thickness of 50 nm on the resultant. A film was formed on the resultant under the same conditions as those of the electron transporting layer 6. The resultant film was measured by X-ray photoelectron spectroscopy. As a result, a peak at a binding energy of 725.0 eV corresponding to a Cs3d5 orbital was obtained, but no peak at a binding energy in the range of 726.0±0.5 eV was obtained.

Example 3

FIG. 4 is a schematic sectional view showing an organic electroluminescence device produced in this example.

Glass was used in the substrate 1, chromium was used in the anode 2, H-2 was used in the hole transporting layer 4, the mixture of H-1 and A-9 was used in the light emitting layer 5, E-12 was used in the electron transporting layer 6, the mixture of E-12 and a cesium suboxide was used in the electron injecting layer 7, and IZO was used in the cathode 9. A production procedure for the device is shown below.

Chromium was formed into a film having a thickness of 100 nm (anode 2) on the glass substrate 1 by a sputtering method. After that, the resultant was washed with acetone and isopropyl alcohol, and was then dried in a vacuum. After that, the surface of chromium was subjected to a UV/ozone treatment.

Next, H-2 was formed into a film having a thickness of 50 nm (hole transporting layer 4) at a film formation rate of 0.50 nm/sec or more to 0.52 nm/sec or less by using a vacuum vapor deposition apparatus. Next, H-1 and A-9 were co-deposited from the vapor, whereby a film of the mixture of H-1 and A-9 having a thickness of 30 nm (light emitting layer 5) was formed. At this time, the film formation rate of H-1 was 0.50 nm/sec or more to 0.52 nm/sec or less, and the film formation rate of A-9 was 0.05 nm/sec or more to 0.07 nm/sec or less. Further, E-12 was deposited from the vapor at a film formation rate of 0.30 nm/sec or more to 0.32 nm/sec or less, whereby a film having a thickness of 10 nm (electron transporting layer 6) was formed.

A metal cesium dispenser (manufactured by SAES Getters) and E-12 were co-deposited from the vapor onto the resultant under the introduction of 0.5 L of oxygen, whereby a film of the mixture of the metal cesium dispenser and E-12 having a thickness of 50 nm (electron injecting layer 7) was formed. At this time, the film formation rate of the cesium suboxide was 0.15 nm/sec or more to 0.18 nm/sec or less, and the film formation rate of E-12 was 0.30 nm/sec or more to 0.32 nm/sec or less.

After that, IZO was formed into a film having a thickness of 150 nm (cathode 9) by a sputtering method. Under a nitrogen atmosphere, the resultant device was finally sealed with a glass cap containing a moisture gettering agent, whereby an organic electroluminescence device was obtained.

Next, the device was evaluated for each of its current efficiency and lifetime by the same approach as that of Example 1. The results are shown below.

| | |
|---|---|
| Current efficiency after continuous light emission for 200 hours | 7.8 cd/A |
| Rate of change | 9.7% |

In addition, chromium was formed into a film having a thickness of 5 nm on a glass substrate separately prepared, and then gold was formed into a film having a thickness of 50 nm on the resultant. A film was formed on the resultant under the same conditions as those of the electron injecting layer 7. The resultant film was measured by X-ray photoelectron spectroscopy. As a result, a peak at a binding energy of 726.1 eV corresponding to a Cs3d5 orbital, and two kinds of peaks at binding energies of 531.3 eV and 532.9 eV corresponding to an O1s orbital were obtained. The element ratio A/B calculated from an area ratio of the peak A (726.1 eV) to the peak B (531.1 eV) among the peaks was 3.1.

Example 4

An organic electroluminescence device was produced by the same approach as that of Example 3 except that the electron injecting layer 7 was formed under the introduction of 0.3 L of oxygen upon vacuum vapor deposition of the metal cesium dispenser by resistance heating.

Next, the device was evaluated for each of its current efficiency and lifetime by the same approach as that of Example 1. The results are shown below.

| | |
|---|---|
| Current efficiency after continuous light emission for 200 hours | 8.0 cd/A |
| Rate of change | 5.3% |

In addition, chromium was formed into a film having a thickness of 5 nm on a glass substrate separately prepared, and then gold was formed into a film having a thickness of 50 nm on the resultant. A film was formed on the resultant under the same conditions as those of the electron injecting layer 7. The resultant film was measured by X-ray photoelectron spectroscopy. As a result, a peak at a binding energy of 726.2 eV corresponding to a Cs3d5 orbital, and two kinds of peaks at binding energies of 531.1 eV and 532.7 eV corresponding to an O1s orbital were obtained. The element ratio A/B calculated from the peak A (726.2 eV) and the peak B (531.1 eV) among the peaks was 4.2.

Example 5

An organic electroluminescence device was produced by the same approach as that of Example 3 except that the electron injecting layer 7 was formed under the introduction of 0.1 L of oxygen upon vacuum vapor deposition of the metal cesium dispenser by resistance heating.

Next, the device was evaluated for each of its current efficiency and lifetime by the same approach as that of Example 1. The results are shown below.

| | |
|---|---|
| Current efficiency after continuous light emission for 200 hours | 7.4 cd/A |
| Rate of change | 8.1% |

In addition, chromium was formed into a film having a thickness of 5 nm on a glass substrate separately prepared, and then gold was formed into a film having a thickness of 50 nm on the resultant. A film was formed on the resultant under the same conditions as those of the electron injecting layer 7. The resultant film was measured by X-ray photoelectron spectroscopy. As a result, a peak at a binding energy of 726.1 eV corresponding to a Cs3d5 orbital, and two kinds of peaks at binding energies of 531.2 eV and 532.8 eV corresponding to an O1s orbital were obtained. The element ratio A/B calculated from the peak A (726.2 eV) and the peak B (531.2 eV) among the peaks was 7.3.

Comparative Example 4

An organic electroluminescence device was produced by the same approach as that of Example 3 except that the electron injecting layer 7 was formed under the introduction of 0.05 L of oxygen upon vacuum vapor deposition of the metal cesium dispenser by resistance heating.

Next, the device was evaluated for each of its current efficiency and lifetime by the same approach as that of Example 1. The results are shown below.

| | |
|---|---|
| Current efficiency after continuous light emission for 200 hours | 5.3 cd/A |
| Rate of change | 32.0% |

In addition, chromium was formed into a film having a thickness of 5 nm on a glass substrate separately prepared, and then gold was formed into a film having a thickness of 50 nm on the resultant. A film was formed on the resultant under the same conditions as those of the electron injecting layer 7. The resultant film was measured by X-ray photoelectron spectroscopy. As a result, a peak at a binding energy of 726.2 eV corresponding to a Cs3d5 orbital, and two kinds of peaks at binding energies of 531.5 eV and 532.7 eV corresponding to an O1s orbital were obtained. The element ratio A/B calculated from the peak A (726.3 eV) and the peak B (531.2 eV) among the peaks was 12.5.

Comparative Example 5

An organic electroluminescence device was produced by the same approach as that of Example 3 except that the electron injecting layer 7 was formed under the introduction of 1.0 L of oxygen upon vacuum vapor deposition of the metal cesium dispenser by resistance heating.

Next, the device was evaluated for each of its current efficiency and lifetime by the same approach as that of Example 1. The results are shown below.

| | |
|---|---|
| Current efficiency after continuous light emission for 200 hours | 4.6 cd/A |
| Rate of change | 18.0% |

In addition, chromium was formed into a film having a thickness of 5 nm on a glass substrate separately prepared, and then gold was formed into a film having a thickness of 50 nm on the resultant. A film was formed on the resultant under the same conditions as those of the electron injecting layer 7. The resultant film was measured by X-ray photoelectron spectroscopy. As a result, a peak at a binding energy of 725.5 eV corresponding to a Cs3d5 orbital, and two kinds of peaks at binding energies of 530.5 eV and 532.5 eV corresponding to an O1s orbital were obtained. The element ratio A/B calculated from the peak A (725.5 eV) and the peak B (530.5 eV) among the peaks was 2.3.

As is apparent from a comparison between the results of Example 1 and the results of Comparative Examples 1 and 2, between the results of Example 2 and the results of Comparative Example 3, or between the results of Examples 3 to 5 and the results of Comparative Examples 4 and 5, the organic electroluminescence device of the present invention is excellent in light emitting property and lifetime.

This application claims priority from Japanese Patent Application No. 2006-097177 filed on Mar. 31, 2006, which is hereby incorporated by reference herein.

The invention claimed is:

1. An organic electroluminescence device comprising:

a pair of electrodes formed of an anode and a cathode; and an organic compound layer provided between the pair of electrodes, wherein the organic electroluminescence device contains a cesium suboxide in which an element ratio A/B calculated from an area ratio of a peak A at a binding energy of 726.0 eV±0.5 eV corresponding to a Cs3d5 orbital measured by X-ray photoelectron spectroscopy to a peak B at a binding energy of 531.0 eV±0.5 eV corresponding to an O1s orbital measured by the X-ray photoelectron spectroscopy is in a range of 3.1 to 7.3.

2. The organic electroluminescence device according to claim 1, wherein the element ratio A/B is in a range of 3.1 to 4.2.

3. The organic electroluminescence device according to claim 1, wherein the cesium suboxide is incorporated into the organic compound layer.

4. The organic electroluminescence device according to claim 1, wherein the cesium suboxide is incorporated into a layer in electrical contact with the cathode.

5. The organic electroluminescence device according to claim 1, wherein the cathode comprises a transparent electrode.

6. The organic electroluminescence device according to claim 1, wherein the organic compound layer comprises a low-molecular-weight compound.

7. The organic electroluminescence device according to claim 1, wherein light is extracted from at least a side of the cathode.

8. The light emitting apparatus comprising a plurality of organic electroluminescence devices each of which comprises the organic electroluminescence device according to claim 1 in its surface.

* * * * *